United States Patent [19]

Chaput et al.

[11] 4,365,168

[45] Dec. 21, 1982

[54] ELECTRICAL CIRCUIT ON PORCELAIN COATED METAL SUBSTRATES

[75] Inventors: Guy J. Chaput, Carleton Place; Edward M. Sich, Ottawa, both of Canada

[73] Assignee: Northern Telecom Limited, Montreal, Canada

[21] Appl. No.: 167,734

[22] Filed: Jul. 14, 1980

[51] Int. Cl.³ .............................................. H01H 13/70
[52] U.S. Cl. ................................. 307/115; 200/5 A; 340/365 C; 361/402
[58] Field of Search ............... 361/274, 331, 301, 402; 307/115; 340/365 C; 200/5 A, 292

[56] References Cited

U.S. PATENT DOCUMENTS 4,029,916 6/1977 Chu ....................................... 200/5 A
4,046,981 9/1977 Johnson et al. ................ 200/5 A X

*Primary Examiner*—G. Z. Rubinson
*Assistant Examiner*—James L. Dwyer
*Attorney, Agent, or Firm*—R. J. Austin

[57] ABSTRACT

A porcelain coated metal substrate bearing a printed circuit and in which a capacitive coupling is created between the substrate and the circuit to eliminate unwanted frequencies. This coupling is formed by the inclusion of a conductive element on the porcelain. The conductive element is out of direct electrical contact with the printed circuit and has a means to connect the element to ground. Connection to ground provides the desired capacitive coupling and another capacitive coupling from the metal substrate to the conductive element, the two couplings being in series.

5 Claims, 8 Drawing Figures

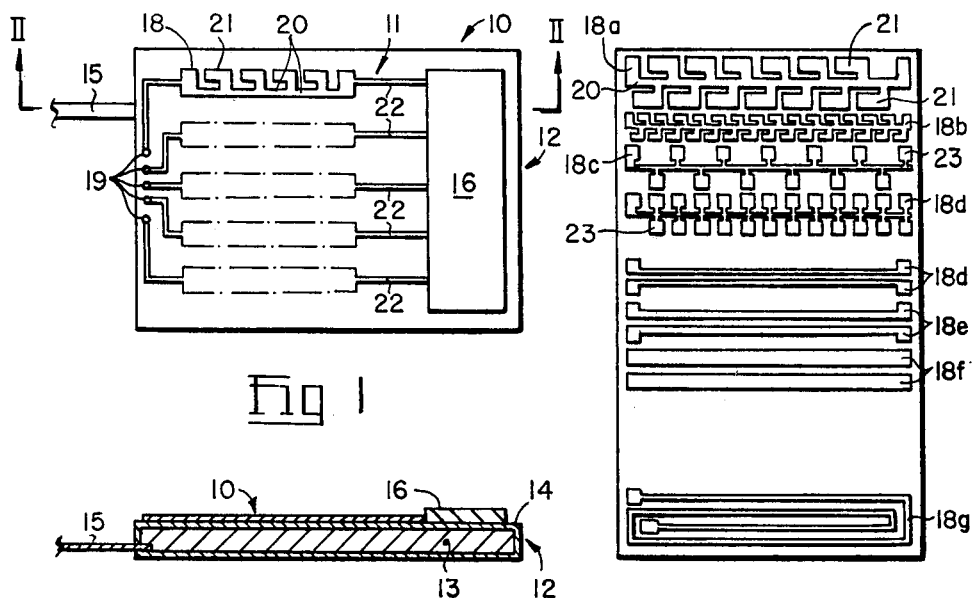
Fig 1   Fig 3
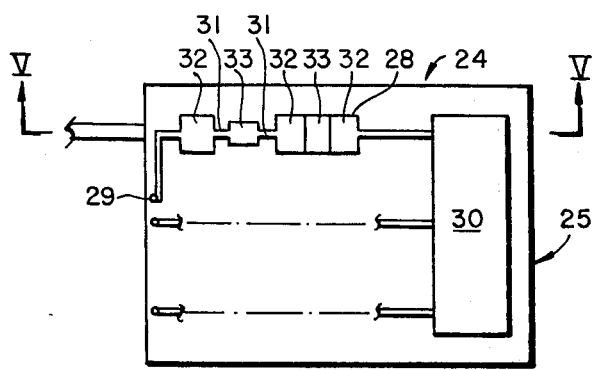
Fig 2
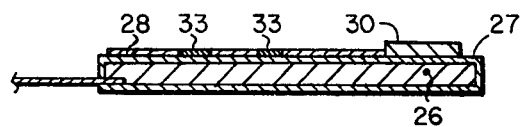
Fig 4
Fig 5

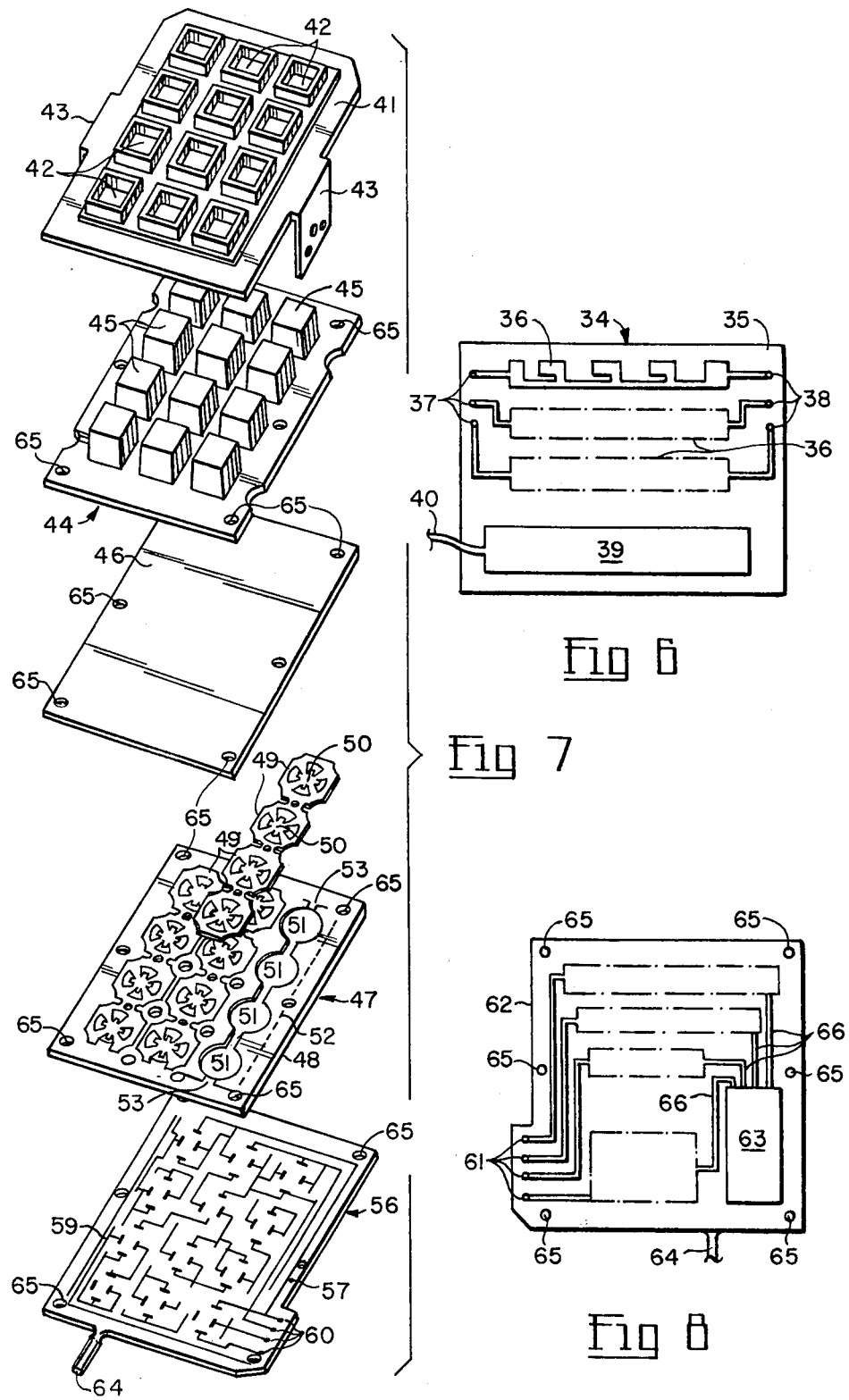

ELECTRICAL CIRCUIT ON PORCELAIN COATED METAL SUBSTRATES

This invention relates to electrical circuits on porcelain coated metal substrates.

Suggestions are being put forward for the replacement of conventional printed circuit boards with circuits printed upon porcelain coats formed upon metal substrates such as steel. The attractiveness of replacing conventional printed circuit boards is mainly economic in that the resin/glass fibre substrate, copper coating, etching, nickel plating and gold plating techniques are avoided. The new suggested process involves much cheaper production techniques in providing the porcelain coat upon the steel substrate and forming the circuit by thick film printing techniques.

Although a cheaper product thus results, proprietary electrical filters formed from proprietary components are still required in the circuit to eliminate undesirable frequencies which, for instance, result in sound distortion or interference in use of audio equipment such as microphones or telecommunications equipment.

The present invention is concerned with the provision of a circuit board comprising a porcelain coated metal substrate bearing a printed electrical circuit in which undesirable frequencies may be eliminated without the use of conventional filters.

According to the present invention, a circuit board comprises an electrically conductive metal substrate having a porcelain layer on at least one of its surfaces and a printed electrical circuit on said porcelain layer, the board also having means to produce a capacitance effect from the printed circuit to the metal substrate, the value of the capacitor being determined by the area of contact between the printed circuit and the porcelain layer and the thickness of the porcelain layer.

The means to produce the capacitor may be a means to connect the metal substrate to ground. Alternatively, a further capacitance effect may be created between the metal substrate and a further conductive element which is itself connectable to ground.

Broadly speaking, the invention thus resides in the realization that the porcelain coated metal substrate may actually form a part of the circuit which also includes the printed circuit instead of being used solely as a physical support which has been the only reason for its previous use. In the invention, recognition is given to the electrical properties of the porcelain and also of the metal substrate together with the printed circuit. The required capacitance may be obtained by changing one or more of certain variables. The capacitor and leakage effects are dependent partly upon the thickness of the porcelain layer which dictates the distance between the porcelain and the metal substrate. In addition, the capacitance is dependent upon the area of contact between the printed circuit and the porcelain layer. Given a fixed distance across the porcelain for provision of the printed circuit, the printed circuit may be designed to have the desired area of contact while providing the necessary electrical potential from one end to the other. Hence, it may be essential to print the printed circuit with wide conducting areas between narrower conducting areas, the wide areas being instrumental in producing the area of contact and the narrow areas forming the small cross-sectional conductive areas for controlling the potential difference. Alternatively, or in addition, the required area of contact is produced by providing the printed circuit along a folded and thus lengthened path between its start and finishing positions. The capacitance and leakage effects are, of course, distributed along the length of the printed circuit.

In certain constructions, at least one resistor is disposed in the printed circuit to influence the electrical characteristics of the circuit. Conveniently, the resistor is formed between spaced conductor portions of the printed circuit by film printing techniques using a printing ink having desirable electrical properties. Such a resistor will also produce capacitance and resistance effects together with the porcelain layer and the metal substrate, and may result in elimination of undesirable frequencies which are different from those eliminated between the conducting portions of the circuit and the metal substrate.

Circuit boards according to the invention are of particular use in audio equipment where radio and other high frequencies may be eliminated so as not to interfere with the desired audio frequencies.

Hence the invention also includes audio equipment which comprises a circuit board according to the invention. Of particular interest is the use of a circuit board in a pushbutton switch assembly of telecommunications apparatus.

A pushbutton switch assembly for telecommunications apparatus according to the invention comprises pushbutton means and a switch contact circuit associated with the pushbutton means so as to have contact areas connected by operation of the pushbutton means, and a circuit board according to the invention defined above, the printed circuit being connected to the switch contact circuit to transmit an audio signal to a desired destination upon connection of said contact areas.

Embodiments of the invention will now be described by way of example with reference to the accompanying drawings in which:

FIG. 1 is a plan view of a circuit board according to a first embodiment;

FIG. 2 is a cross-sectional view of the board of FIG. 1 taken along line II—II in FIG. 1 and showing the material thickness not to scale;

FIG. 3 is a view similar to FIG. 1 showing alternative printed circuit designs in modifications of the first embodiment;

FIG. 4 is a plan view of a circuit board according to a second embodiment;

FIG. 5 is a cross-sectional view taken along line V—V in FIG. 4;

FIG. 6 is a plan view of a circuit board according to a third embodiment;

FIG. 7 is an exploded isometric view of a pushbutton assembly for a telephone dial incorporating a circuit board according to another embodiment;

FIG. 8 is an underside plan view of the circuit board incorporated in the assembly of FIG. 6.

In a first embodiment as shown in FIGS. 1 and 2, a circuit board 10 comprises a circuit 11 printed upon a planar support 12.

The support 12 is formed by a metal, i.e. steel sheet 13 substrate coated on at least its upper surface with a layer of porcelain 14. A particular way of forming the porcelain layer is by electrodeposition of a frit on the steel sheet, followed by firing. Conveniently it may be easier during forming the layer, to coat the whole steel sheet in frit so as to have it covered by porcelain on both surfaces as shown by FIG. 2.

It is a desirable feature of the invention that the steel sheet has a means by which it is connectable to ground. As shown in FIGS. 1 and 2, a ground lead 15 is soldered or otherwise electrically attached to the steel sheet and extends outwardly from the porcelain for making a ground connection. Clearly, attachment of the ground lead is made before covering the steel sheet with frit and firing it.

The circuit board also comprises upon its upper surface, an integrated circuit device 16 attached to the porcelain layer. This device is located in a position spaced from ground lead 15 and, in fact, lies in an extreme position on the support 12 from the lead.

The printed circuit 11 is formed, for instance, by thick film techniques. In one such technique, the circuit pattern is formed from an ink containing silver and glass particles, the ink being fired at, say 600° C., to transform the ink into a hard coating which is held together and to the porcelain by the glass particles. Instead of silver, paladium or platinum particles may be used, for instance.

Because of the ground lead 15, a capacitance created from the printed circuit pattern to the steel sheet. The value of this effect depends upon the electrical characteristics of the porcelain, but may be determined to give a desired value by providing the porcelain with a desired thickness and presenting a predetermined surface area of contact between the printed circuit and the porcelain. Hence, the value of the capacitance and resistor effect is built into the circuit board to remove whatever frequencies are required to be filtered from the circuit and before current reaches the integrated circuit 16. The desired area of contact between each conductor 18 and the porcelain is producible by forming the conductor in a certain shape between its input terminal 19 and the integrated circuit. As shown in FIG. 1, in one example, each conductor 18 has narrow section portions 20 for determining the resistance, and larger spaced regions 21 projecting from one side of the conductor and joined by sections 20. Obviously while the regions 21 have no effect upon the electrical resistance characteristics from the input end up to the circuit 16, their size dictates the area of contact between the conductor and the porcelain.

It will be noted that the integrated circuit 16 is disposed at the end of the support 12 remote from the ground lead 15. This minimizes any interference effect upon the circuit 16 by the use of the steel plate as part of the capacitor. The steel is slightly inductive and thus assists in preventing or minimizing interference in this way. Further, the integrated circuit is isolated as far as possible from the printed circuit to minimize interference by providing conductor regions 22 to the integrated circuit with as small a cross-sectional area as is practicable when taking into account the current which has to flow to the integrated circuit.

In use, thickness of the upper porcelain layer and the area of contact between each conductor 18 with the porcelain dictates the lossy capacitance effects and these may be predetermined to eliminate or minimize undesirable frequencies reaching the integrated circuit 16.

FIG. 3 shows various modifications to the shape of the printed circuit in the first embodiment. Each of these shapes is chosen to provide a certain contact area between a conductor and the porcelain to give a required lossy capacitance effect.

For instance, as shown, in one modification conductor 18a has larger spaced regions 21 at each side of narrow section 20. In another modification, a conductor 18b has the same pattern as conductor 18a but has a smaller scale dictated by its requirements. In conductors 18c and 18d, the larger regions 23 are of different shape, with 18d producing a greater contact surface area with the porcelain by using more regions 23.

In the designs of conductors, 18d, 18e and 18f, the required contact area is obtained by providing each conductor with parallel sides and with no enlarged regions. Conductor 18g provides the required contact area by causing it to pass backwards and forwards across the support between its terminals.

As shown in FIGS. 4 and 5, in a second embodiment, a circuit board 24 has a support 25 of metal substrate 26 and porcelain 27 construction as described in the first embodiment. In this embodiment, each conductor 28 extending from inlet terminal 29 to integrated circuit 30 has narrow sections 31 and larger regions 32 to provide the resistance effects of the conductor and the lossy capacitance effects in conjunction with the substrate 26. Each conductor also has a plurality of resistors 33 located along its length, the resistors having been added by thick film printing using printing inks with suitable electrical properties. In this construction, the resistors 33 also provide a lossy capacitance effect in conjunction with the metal substrate over the whole contact surface area of the resistors with the porcelain. The resistances of resistors 33 may be changed by using printing inks with different ohms/square materials.

In a third embodiment (FIG. 6), a circuit board 34 is provided. This board has a support of metal substrate (not shown) covered overall in a porcelain layer 35. A printed circuit on an upper surface of the layer 35 comprises conductors 36 in parallel, each extending between inlet and outlet terminals 37, 38 at opposite ends of the support. Each conductor is shaped to give a desired area of contact with the porcelain as described above. In this embodiment, no integrated circuit is carried by the board. Instead, an integrated circuit (not shown) is carried by a second board (not shown) and is joined to the outlet terminals 38. The use of the second board ensures that the integrated circuit is completely isolated from the metal substrate of board 34 and cannot pick up any interference from the board.

In this embodiment, the lossy capacitance effect from the printed circuit to the metal substrate is not provided by equipping the metal substrate with a ground connection. Instead, an additional conductor plate 39 is thick film printed, in the manner of the printed circuit, on the upper surface of the porcelain as shown. Alternatively, the plate 39 is printed upon the lower surface. The plate 39 is provided with its own ground connection 40.

In use, two capacitance effects are created in series to give the desired frequency elimination effects. The first of these is between each of the conductors 36 and the metal substrate and the second between the substrate and the plate 39.

In a fourth embodiment, a circuit board is incorporated into a pushbutton switch assembly of a telecommunications apparatus. In this embodiment as shown by FIG. 7, the pushbutton assembly comprises a moulded plastic bezel 41 with apertures 42 in rows. Brackets 43 moulded integrally with the bezel at its sides provide mounting means for the assembly to a chassis (not shown).

On the underside of the bezel is a moulded button or key plate 44 which contacts the bezel, and has integrally moulded keys or buttons 45 extending, one through each aperture 42 in the bezel. The keys are joined to the plate at one side of each key only, so that a resilient hinging effect is created which enables the keys to be manually depressed through the apertures.

Beneath the plate 44 is a thin resiliently flexible membrane 46 and then a spring contact assembly 47. The spring contact assembly 47 comprises a support member 48 for three strips 49 each comprising four spring contact members 50. The member 48 has a plurality of apertures 51 corresponding in position to the apertures 42 in the bezel. Each strip 49 is located in a desired position on the support member by its reception within a shallow recess 52 in the support member, and ends of the strips fit in slits cut in a key member 53 at each end of the support member.

The spring contact members 50 are held in position over the apertures 51, one to each aperture, by positioning of the strips 49. Each contact member is conveniently in the form described in U.S. Pat. No. 4,029,916, having a snap action when the center portion of a contact member is depressed by depression of a key 45 directly above it. When a contact member snaps down through its aperture 51, contacts 50 move into engagement with a contact area 54 of a circuit board 56.

The circuit board 56 comprises a support member 57 formed from a steel sheet substrate (not shown) and bearing a porcelain covering layer 58 on all surfaces. The support member is manufactured in the manner described in the first embodiment. On the upper surface of the porcelain is a switch contact circuit 59 which has a contact area 54 disposed below each of the apertures 51.

The contact circuit 59 has outlet terminals 60 which are electrically connected by means of strip conductors (not shown) with inlet terminals 61 of a printed circuit 62 on the under surface of the porcelain (FIG. 8), the circuit 62 being connected to an integrated circuit 63 at one end of the support member. The circuits 59 and 62 are both printed by thick film techniques in the manner described above. The steel sheet of the support member has a ground connection 64 extending from it for grounding purposes. The support member has six spaced holes 65 for alignment with corresponding holes 65 in the membrane 46, plate 44 and support member 48 when the elements are assembled together by passage of studs (not shown) moulded on the undersurface of the bezel 41. The holes 55 in the support member are formed by drilling them in the steel sheet before the porcelain layer is added, care being taken to cover the metal within the holes with porcelain while leaving the holes; unblocked and free for passage of the studs. This ensures that the only ground connection is by way of item 64.

The circuit board 56 is designed to eliminate or minimize radio and other high frequency signals from reaching the integrated circuit which may, for instance, be an amplifier. The design of the printed circuit taken in conjunction with the thickness of the porcelain layer and its electrical properties is such as to effect high frequency decoupling while allowing audio frequencies to pass to the integrated circuit. The use of steel as the substrate effectively increases the radio frequency decoupling. A high capacitance to ground should be avoided as this may affect audio frequency reception at the integrated circuit. For this purpose, the final conductors 66 to the integrated circuit are designed as narrow as possible.

In the last preceding embodiment, a single element, i.e. the board 56 operates to carry the switch contact circuit 59, the printed circuit 62 which eliminates unwanted frequencies from the signal, and the integrated circuit which may include the amplifier. While providing all these various elements in a small package, costly proprietary filter items are avoided and replaced relatively cheaply by incorporating filtering means into the board itself by way of forming the capacitor and resistor effect between the printed circuit and the steel substrate.

In a modification of the last embodiment, the integrated circuit is included upon a mounting which is separate from the circuit board 56.

What we claim is:

1. A circuit board comprising an electrically conductive metal substrate having a porcelain layer on at least one of its surfaces, a printed electrical circuit on said porcelain layer, a conductive element carried by the porcelain layer and spaced from the metal substrate by the porcelain layer, the conductive element and the printed electrical circuit not being directly electrically connected together, and means to connect the conductive element to ground to provide one capacitive coupling from the printed circuit to the metal substrate and another capacitive coupling from the metal substrate to the conductive element and in series with said one capacitive coupling, the value of said one capacitive coupling being determined by the area of contact between the printed circuit and the porcelain layer and by the thickness of the porcelain layer.

2. A pushbutton switch assembly for telecommunications apparatus comprising pushbutton means and a switch contact circuit associated with the pushbutton means so as to have contact areas connected by operation of the pushbutton means, and a circuit board according to claim 1, the printed circuit being connected to the switch contact circuit to transmit an audio signal to a desired destination upon connection of said contact areas and said conductive element connected to ground potential.

3. A circuit board according to claim 1 wherein the printed circuit has at least one conductor which is printed with large and small width portions to give the desired area of contact with the porcelain layer.

4. A circuit board according to claim 1 provided with at least one resistor connecting portions of the conductor in series, the resistor formed by printing techniques and providing a capacitance effect with the metal substrate.

5. A circuit board according to claim 1 having an integrated circuit carried upon the porcelain and electrically connected to the printed circuit.

* * * * *